(12) United States Patent
Chang

(10) Patent No.: US 12,027,403 B2
(45) Date of Patent: Jul. 2, 2024

(54) PICK-AND-PLACE SYSTEM WITH A STABILIZER

(71) Applicant: Taiwan Semiconductor Manufacturing Company, Ltd., Hsinchu (TW)

(72) Inventor: Jen-Yuan Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 282 days.

(21) Appl. No.: 17/700,497

(22) Filed: Mar. 22, 2022

(65) Prior Publication Data

US 2023/0307281 A1 Sep. 28, 2023

(51) Int. Cl.
| | |
|---|---|
| *H01L 21/68* | (2006.01) |
| *B65G 47/90* | (2006.01) |
| *B65G 47/91* | (2006.01) |
| *H01L 21/67* | (2006.01) |
| *H01L 21/683* | (2006.01) |

(52) U.S. Cl.
CPC .......... *H01L 21/681* (2013.01); *B65G 47/905* (2013.01); *B65G 47/91* (2013.01); *H01L 21/67121* (2013.01); *H01L 21/6838* (2013.01)

(58) Field of Classification Search
CPC ............ H01L 21/67121; H01L 21/681; H01L 21/68764; H01L 21/6838; H01L 21/68742; B65G 47/91

USPC ......................................................... 156/556
See application file for complete search history.

(56) References Cited

U.S. PATENT DOCUMENTS 10,950,572 B2 * 3/2021 Yu ........................... H01L 24/80

FOREIGN PATENT DOCUMENTS

| TW | 202017092 A | 5/2020 |
|---|---|---|
| TW | 202137367 A | 10/2021 |

OTHER PUBLICATIONS

First office action received in the corresponding Taiwan application 112104314, dated Dec. 5, 2023.

* cited by examiner

*Primary Examiner* — James D Sells
(74) *Attorney, Agent, or Firm* — Kilpatrick Townsend & Stockton LLP

(57) ABSTRACT

A pick-and-place system is provided. The pick-and-place system includes: a wafer holder configured to hold a bottom die; a gantry having a stabilizer extending downwardly; a primary drive mechanism connected to the gantry and configured to drive the gantry horizontally and vertically; a suction head configured to hold a top die; and a secondary drive mechanism located at the gantry and connected to the suction head and configured to drive the suction head horizontally and vertically to place the top die on the bottom die at a target position. The primary drive mechanism drives the gantry vertically until the stabilizer is in contact with the bottom die before the secondary drive mechanism drives the suction head.

20 Claims, 15 Drawing Sheets

PICK-AND-PLACE SYSTEM WITH A STABILIZER

FIELD

Embodiments of the present disclosure relate generally to semiconductor packaging, and more particularly to a pick-and-place system used for semiconductor packaging.

BACKGROUND

In recent years, the semiconductor industry has experienced rapid growth due to continuous improvement in the integration density of a variety of electronic components (e.g., transistors, diodes, resistors, capacitors, etc.). For the most part, improvement in integration density has resulted from iterative reduction of minimum feature size, which allows more components to be integrated into a given area.

These continuously scaled electronic components require smaller packages that occupy less area than previous packages. Exemplary types of packages include quad flat pack (QFP), pin grid array (PGA), ball grid array (BGA), flip chips (FC), three-dimensional integrated circuits (3D ICs), wafer-level packages (WLPs), and package on package (PoP) devices. For instance, the front-end, 3D IC stacking technologies are used for re-integration of chiplets partitioned from System on Chip (SoC). The resulting integrated chip outperforms the original SoC in system performance. It also affords the flexibility to integrate additional system functionalities. Advantages of those advanced packaging technologies like 3D IC stacking technologies include improved integration density, faster speeds, and higher bandwidth because of the decreased length of interconnects between the stacked chips. However, there are quite a few challenges to be handled for the technologies of advanced packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
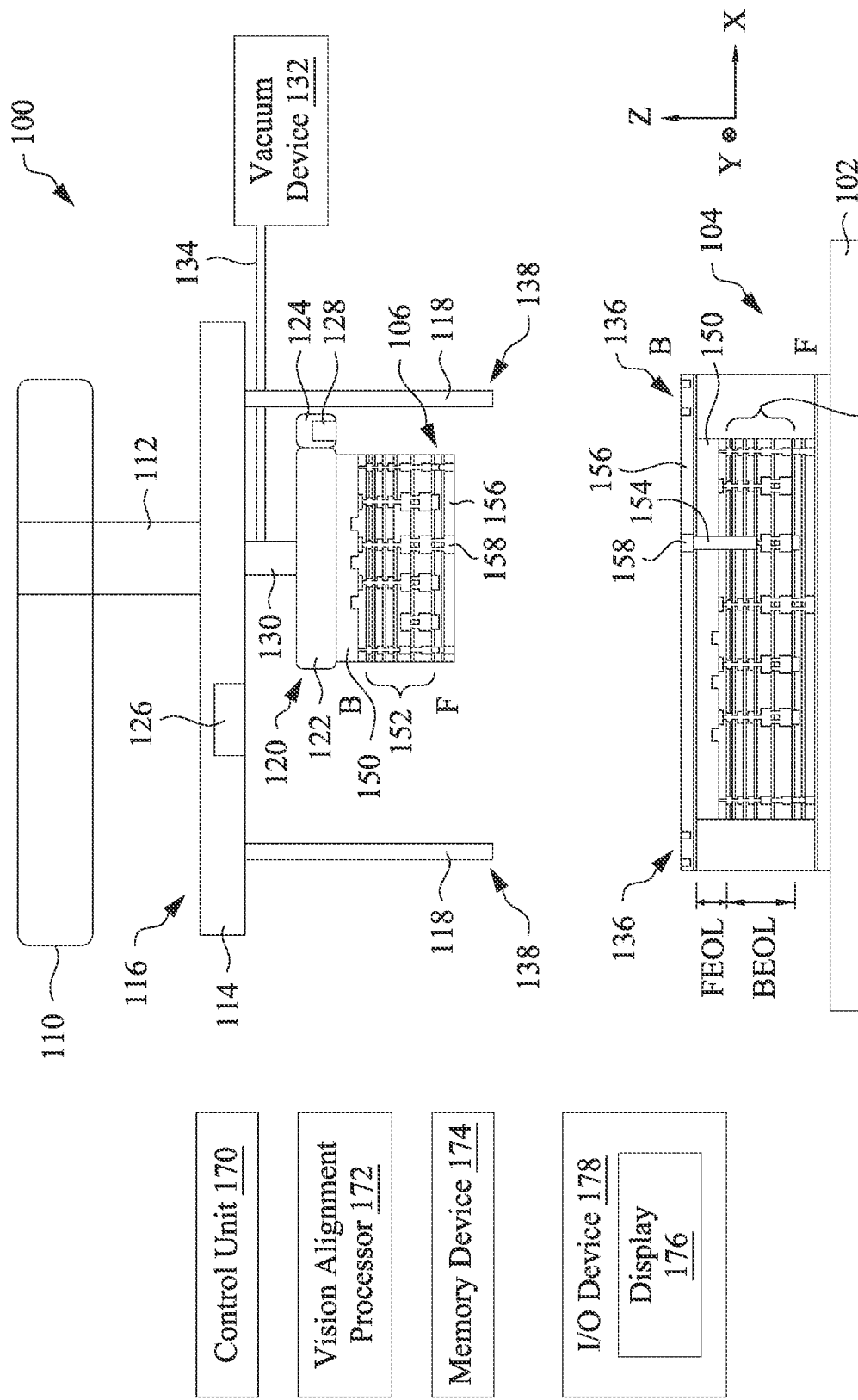
FIG. 1 is a schematic diagram illustrating an example pick-and-place system in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed."

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Packaging technologies were once considered just back-end processes, almost an inconvenience. Times have changed. Computing workloads have evolved more over the past decade than perhaps the previous four decades. Cloud computing, big data analytics, artificial intelligence (AI), neural network training, AI inferencing, mobile computing on advanced smartphones, and even self-driving cars are all pushing the computing envelope. Modern workloads have brought packaging technologies to the forefront of innovation, and they are critical to a product's performance, function, and cost. These modern workloads have pushed the product design to embrace a more holistic approach for optimization at the system level.

Stacking chiplets, or modular dies, with multi-layers, multi-chip sizes, and multi-functions is at the heart of advanced packaging technologies. Among other technologies, hybrid bonding (HB) is key component of stacking chiplets. Hybrid bonding is a process that stacks and bonds dies using both dielectric bonding layers and metal-to-metal interconnects in advanced packaging. Hybrid bonding can provide improved integration density, faster speeds, and higher bandwidth. Hybrid bonding can be used for wafer-to-wafer bonding, die-to-wafer bonding, and die-to-die bonding.

For die-to-wafer boding and die-to-die boding, which involve stacking a die on a wafer, a die on an interposer, or a die on a die, the infrastructure to handle dies without particle adders, as well as the ability to bond dies, becomes a major challenge. Typically, back-end processes, such as dicing, die handling, and die transport on film frame, have to be adapted to front-end clean levels, allowing high bonding yields on a die level. For example, copper hybrid bonding is conducted in a cleanroom in a wafer fab, instead of in an outsourced semiconductor assembly and test (OSAT) facility.

Pick-and-place systems are part of the infrastructure to handle dies in the context of die-to-wafer boding and die-to-die boding. A pick-and-place system is an automatic system that can pick a die (often referred to as a "top die") and place it onto another die (often referred to as a "bottom die") or a host wafer, often in a high-speed manner. A person may take the complexity and difficulty of such tasks of picking and placing a top die for granted. On the contrary, accurate alignment of dies, without comprising the high system throughput, is very challenging, especially considering that the alignment accuracies are on the order of microns (i.e., micrometers). If the position shift error cannot be further reduced, the critical size of hybrid bonding metal pads cannot be reduced, which in turn limits bonding density. Among other things, one particular challenge comes from the fact that the moving parts, especially a suction head, in a pick-and-place system that handle the top die may be shaky and unsteady, subject to various vibrations resulting from various sources in the system. As a result, the position shift error is hard to reduce.

In accordance with some aspects of the disclosure, a pick-and-place system and a method for operating a pick-and-place system are provided. The pick-and-place system has a gantry driven by a primary drive mechanism. A secondary drive mechanism is located at the gantry and drives a suction head to place a top die on a bottom die to achieve, for example, hybrid bonding of the top die and the bottom die. The gantry has a stabilizer extending downwardly. In one example, the stabilizer includes four legs. The primary drive mechanism drives the gantry vertically until the stabilizer is in contact with the bottom die. A vision alignment camera is used in this process to facilitate the alignment. In some embodiments, there are alignment patterns on the bottom die to be used for the alignment. Subsequently, the secondary drive mechanism drives the suction head such that the top die is placed on the bottom die at a target position. Due to the existence of the stabilizer, the movement of the suction head becomes more steady, thereby reducing the position shift error. In some implementations, an optics alignment system monitors the position of the suction head, and an alignment feedback is generated based on the position of the suction head. The secondary drive mechanism then drives the suction head based on the alignment feedback. As such, an alignment feedback loop is achieved using the optics alignment system. The system and method disclosed are generally applicable to various use cases such as die-to-die bonding, die-to-wafer bonding, and the like.

FIG. 1 is a schematic diagram illustrating an example pick-and-place system 100 in accordance with some embodiments. In the example shown in FIG. 1, the pick-and-place system 100 includes a wafer holder 102, a primary drive mechanism 110, an attaching shaft 112, a gantry 114, a secondary drive mechanism 116, a stabilizer 118, a suction head 120, a suction shaft 130, a vision alignment camera 126, an optics alignment system 128, a vacuum device 132, a control unit 170, a vision alignment processor 172, a memory device 174, a display 176, and an I/O device 178. It should be understood that more or fewer components than those shown in FIG. 1 can be employed in other examples. In the example shown in FIG. 1, the pick-and-place system 100 can pick a top die 106, typically coming from a component wafer after a dicing process, and place the top die 106 on a bottom die 104.

The wafer holder 102 is used to hold a wafer or a die. In the example shown in FIG. 1, the bottom die 104 is placed on the wafer holder 102 in a die-to-die bonding context. In other examples, a host wafer can be placed on the wafer holder 102 in a die-to-wafer bonding context. It should be understood that although the bottom die 104 is used as an example throughout the description, the disclosed technologies are also applicable to bonding the top die 106 to a host wafer, in which case there are multiple bottom dies on the host wafer.

In the example shown in FIG. 1, the bottom die 104 has a front side (denoted as "F" in FIG. 1) and a back side (denoted as "B" in FIG. 1). In the example shown in FIG. 1, the bottom die 104 has been flipped, i.e., upside down. A bonding layer 156 is formed at the back side and on a silicon substrate 150. In one implementation, the bonding layer 156 is made of a dielectric and can be used for bonding with another bonding layer 156 at the top die 106.

One or more semiconductor devices (e.g., transistors, resistors, capacitors, inductors, etc.) are formed on the silicon substrate 150, before being flipped, in a front-end-of-line (FEOL) process. A multilayer interconnect (MLI) structure 152 is disposed over the one or more semiconductor devices, before being flipped. The MLI structure 152 includes a combination of dielectric layers and conductive layers configured to form various interconnect structures. The conductive layers are configured to form vertical interconnect features (e.g., device-level contacts, vias, etc.) and horizontal interconnect features (e.g., conductive lines extending in a horizontal plane). Vertical interconnect features typically connect horizontal interconnect features in different layers (e.g., a first metal layer often denoted as "M1" and a fifth metal layer often denoted as "M5") of the MLI structure 152. During operation of bottom die 104, the interconnect structures are configured to route signals and/or distribute signals (e.g., clock signals, voltage signals, ground signals) to the one or more semiconductor devices to fulfill certain functions. It should be understood that although the MLI structure 152 is depicted in FIG. 1 with a given number of dielectric layers and conductive layers, the present disclosure contemplates MLI structures having more or fewer dielectric layers and/or conductive layers depending on design requirements of the bottom die 104.

In the example shown in FIG. 1, the bottom die 104 includes a hybrid bonding metal pad 158 formed in the bonding layer 156, and the hybrid bonding metal pad 158 is connected to the MLI structure 152 through a through-silicon via (TSV) 154, which penetrates the silicon substrate 150 in a vertical direction (i.e., a Z-direction). It should be understood that although only one hybrid bonding metal pad 158 and a TSV 154 is shown in FIG. 1, this is not intended to be limiting.

Likewise, the top die 106 has a front side (denoted as "F" in FIG. 1) and a back side (denoted as "B" in FIG. 1). In the example shown in FIG. 1, the top die 106 has been flipped, i.e., upside down. The silicon substrate 150 of the top die 106 is held (e.g., sucked) to and in contact with the suction head 120, details of which will be described below. A bonding layer 156 is formed at the front side and over a MLI structure 152, before the top die 106 is flipped. In one implementation, the bonding layer 156 is made of a dielectric and can be used for bonding with the bonding layer 156 at the bottom die 104, as mentioned above. Likewise, the top die 106 includes a hybrid bonding metal pad 158 formed in the bonding layer 156, and the hybrid bonding metal pad 158 is connected to the MLI structure 152 through, for example, a via. It should be understood that although only one hybrid bonding metal pad 158 and a TSV 154 are shown in FIG. 1, this is not intended to be limiting.

The top die 106 is picked by the suction head 122, and then the pick-and-place system 100 controls the suction head 120 accordingly to move the top die 106 to a target position, for example, right over the bottom die 104. Subsequently, the suction head 120 places the top die 106 onto the bottom die 104. The top die 106 and the bottom die 104 are bonded because of the bonding layers 158 on each side, in some implementations at room temperatures. In the meantime, the hybrid bonding metal pads 158 on each side are in contact with each other, forming an electrical connection path between the top die 106 and the bottom die 104.

The primary drive mechanism 110 and the gantry 114 are connected through the attaching shaft 112. The primary drive mechanism 110 can drive the gantry 114 both in the vertical direction (i.e., the Z-direction) and in the horizontal plane (i.e., the X-Y plane, that is in the X-direction and/or the Y-direction). In one implementation, the primary drive mechanism 110 is an actuator, a rail, a continuous track, a stepper motor, gears, belts, or a combination thereof. It should be understood that this is not intended to be limiting, and other implementations of the primary drive mechanism 110 are within the scope of the disclosure.

The gantry 114 and the suction head 120 are connected through the suction shaft 130. A secondary drive mechanism 116 is located at the gantry 114 and can drive the suction head 120 both in the vertical direction (i.e., the Z-direction) and in the horizontal plane (i.e., the X-Y plane, that is in the X-direction and/or the Y-direction). In one implementation, the secondary drive mechanism 116 is an actuator, a stepper motor, or a combination thereof. In another implementation, the secondary drive mechanism 116 drives the suction head 120 by using magnetic forces. It should be understood that this is not intended to be limiting, and other implementations of the secondary drive mechanism 116 are within the scope of the disclosure.

The gantry 114 has a stabilizer 118. In one implementation, the stabilizer 118 includes multiple legs extending downwardly from the gantry 114 in the Z-direction. In one example, the stabilizer 118 includes four legs. In another example, the stabilizer 118 includes three legs. It should be understood that these examples are not intended to be limiting, and any leg number that is equal to or larger than three is within the scope of the disclosure, since three points can determine a plane. In one implementation, the stabilizer 118 is made of metal. The stabilizer 118 is in contact with the top surface of the bottom die 104 first, under the control of the primary drive mechanism 110, and then the second drive mechanism 116 controls the suction head 120 to place the top die 106 on the bottom die 104 at the target position. Because the stabilizer 118 is in contact with the top surface of the bottom die 104 first, the suction head 120 becomes more steady when it approaches the bottom die 104 to place the top die 106, thereby reducing the position shift error. It should be understood that various features shown in FIG. 1 are not drawn to scale. For instance, the relative dimensions of the gantry 114, the stabilizer 118, the suction head 120, the top die 106, and the bottom die 104, the wafer holder 102 may be different than those shown in FIG. 1.

A vision alignment camera 126 is located at the gantry 114. The vision alignment camera 126 is a downward camera that can detect the exact position of the gantry 114, and more specifically, the position of the stabilizer landing feet 138, relative to the bottom die 104. A vision alignment processor 172 is utilized to assist the primary drive mechanism 110 in driving the gantry 114 to a target gantry position. In some embodiments, some alignment patterns 136 can be formed on the bottom die 104. Each of the alignment patterns 136 corresponds to each of the stabilizer landing feet 138, and the vision alignment processor 172 and the vision alignment camera 126 can utilize the alignment patterns 136 to adjust the position of the gantry 114 accordingly to achieve an accurate landing of the stabilizer 118.

The vacuum device 132 is connected to the suction shaft 130 through a pipe 134. The suction shaft 130 is hollow and has a passage in the middle that extends in the Z-direction. When the vacuum device 132 operates, the suction head 120 generates a suction force to hold the top die 106 to a bonder region 122. The suction head 120 also includes an auxiliary region 124, which accommodates an optics alignment system 128. The optics alignment system 128 is configured to assist the suction head 120 to adjust its position accordingly and place the top die 106 at the target position, with the help of a control unit 170.

Details of the operations of the primary drive mechanism 110, the secondary drive mechanism 116, the vision alignment camera 126, the alignment pattern 136, and the optics alignment system 128 will be described below with reference to FIGS. 2-12.

The control unit 170 is configured to execute computer program codes stored in the memory device 174 in order to cause the pick-and-place system 100 to fulfill its various functions. In some implementations, the control unit 170 is a controller, a central processing unit (CPU), a multi-processor, a distributed processing system, an application specific integrated circuit (ASIC), and/or a suitable processing unit. It should be understood that the vision alignment processor 172 can be a portion of the control unit 170 in some embodiments.

The memory device 174 is configured to store computer program codes that are executed by the control unit 170 and other information needed for fulfilling various functions of the pick-and-place system 100. In some implementations, the memory device includes one or more of a semiconductor or solid-state memory, a magnetic tape, a removable computer diskette, a random access memory (RAM), a read-only memory (ROM), a rigid magnetic disk, and/or an optical disk. It should be understood that other types of memory devices can be employed as well.

In the example shown in FIG. 1, the pick-and-place system 100 further includes various input/output (I/O) device 178, including a display 176. An operator can input instructions through the input devices such as a mouse, a keyboard, a voice control input device, and the like. The output devices such as the display 176 can present the status of the pick-and-place system 100, the progress of its tasks, and the like, to the operator.

Figure 2:
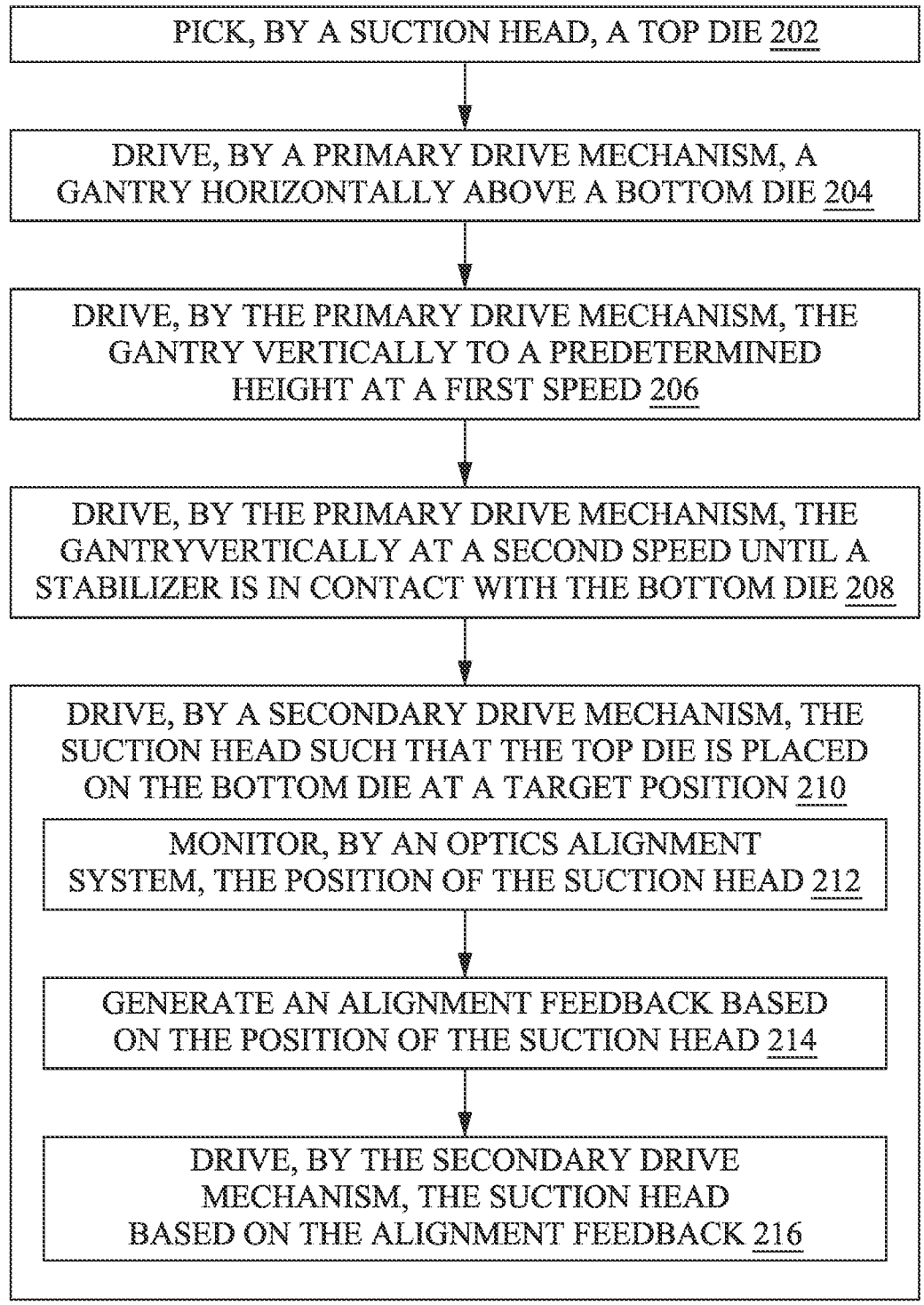
FIG. 2 is a flowchart illustrating an example method for bonding a top die to a bottom die using the pick-and-place system shown in FIG. 1 in accordance with some embodiments.

FIG. 2 is a flowchart illustrating an example method 200 for bonding a top die to a bottom die using the pick-and-place system 100 shown in FIG. 1 in accordance with some embodiments. In the example shown in FIG. 2, the method 200 includes operations 202, 204, 206, 208, and 210. Additional operations may be performed. Also, it should be understood that the sequence of the various operations discussed above with reference to FIG. 2 is provided for illustrative purposes, and as such, other embodiments may utilize different sequences. These various sequences of operations are to be included within the scope of embodiments. FIGS. 3A-3E are schematic diagrams illustrating a portion of the pick-and-place system 100 at various stages in accordance with some embodiments.

At operation 202, the suction head 120 picks the top die 106. In some implementations, the top die 106 comes from a component wafer after the component wafer has been diced using, for example, a blade or laser stealth dicing system. As explained above, the suction head 120 can pick the top die 106 using a suction force generated by the vacuum device 132, and the top die 106 is stuck to the bonder region 122. In some implementations, the top die 106 is selected, ejected from the component wafer using an ejector, picked up and flipped using a flipper if needed, and transferred to the suction head 120. In some embodiments, an up-looking camera is used to determine the exact position of the top die 106 on the suction head 120.

Figure 3A:
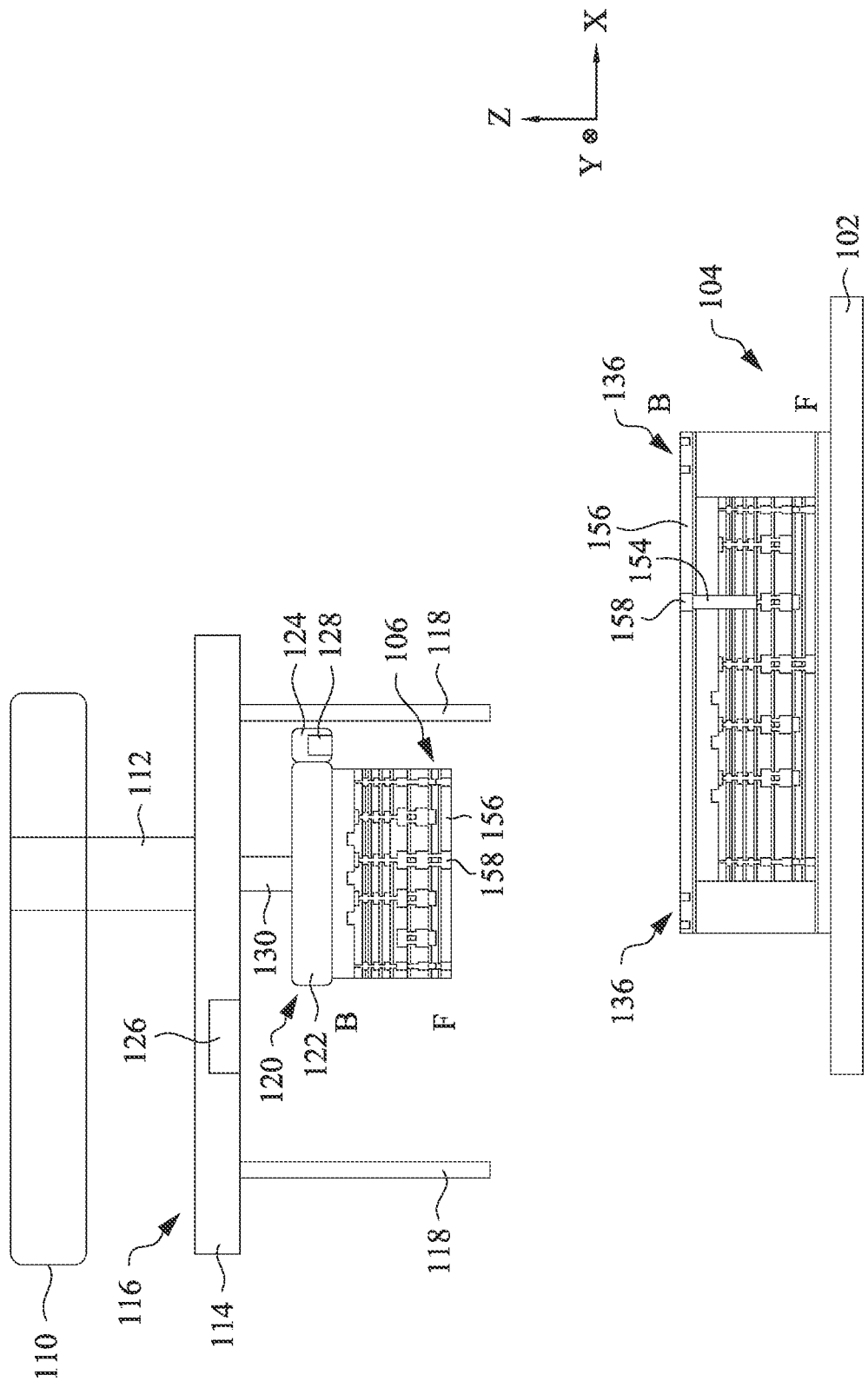
FIGS. 3A-3E are schematic diagrams illustrating a portion of the pick-and-place system at various stages in accordance with some embodiments.

As shown in the example in FIG. 3A, the suction head 120 has picked the top die 106, but the top die 106 is not over the bottom die 104 at the target position where the hybrid bonding metal pads 158 are aligned in the X-Y plane.

The method 200 then proceeds to operation 204, where the primary drive mechanism 110 drives the gantry 114 horizontally above the bottom die 104. In one implementation, the vision alignment camera 126, which is a down-looking camera, can generate a vision. The vision alignment processor 172 can determine the location of the gantry 114 based on the vision. In one embodiment, the alignment patterns 136 on the bottom die 104 can be used as the benchmark to determine the location of the gantry 114 relative to the bottom die 104. Once the location of the gantry 114 relative to the bottom die 104 is known, the vision alignment processor 172 can calculate the distances in the X-direction and the Y-direction, respectively, that the gantry 114 should move. In one example, the primary drive mechanism 110 is a stepper motor, and the stepper motor receives instructions to move the calculated distances in the X-direction and the Y-direction, respectively.

Figure 3B:
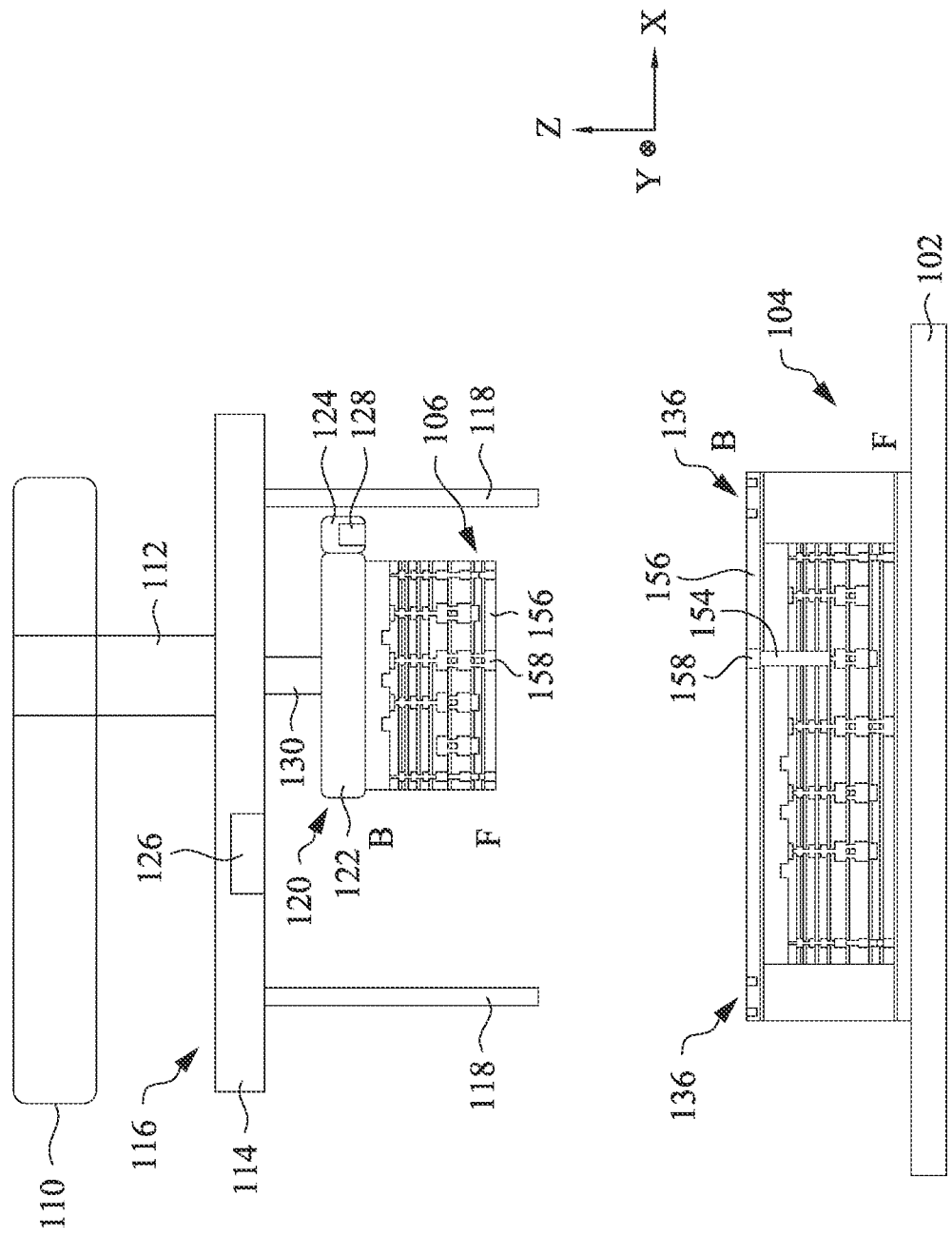

As shown in the example in FIG. 3B, the primary drive mechanism 110 has moved the gantry 114 above the bottom die 104, and the legs of the stabilizer 118 are preliminarily aligned with the corresponding alignment patterns in the X-Y plane. Since the primary drive mechanism 110 has its own movement resolution, which is typically not as fine as that of the secondary drive mechanism 116, the alignment is coarse, without any comprise in the speed of the movement.

Figure 3C:
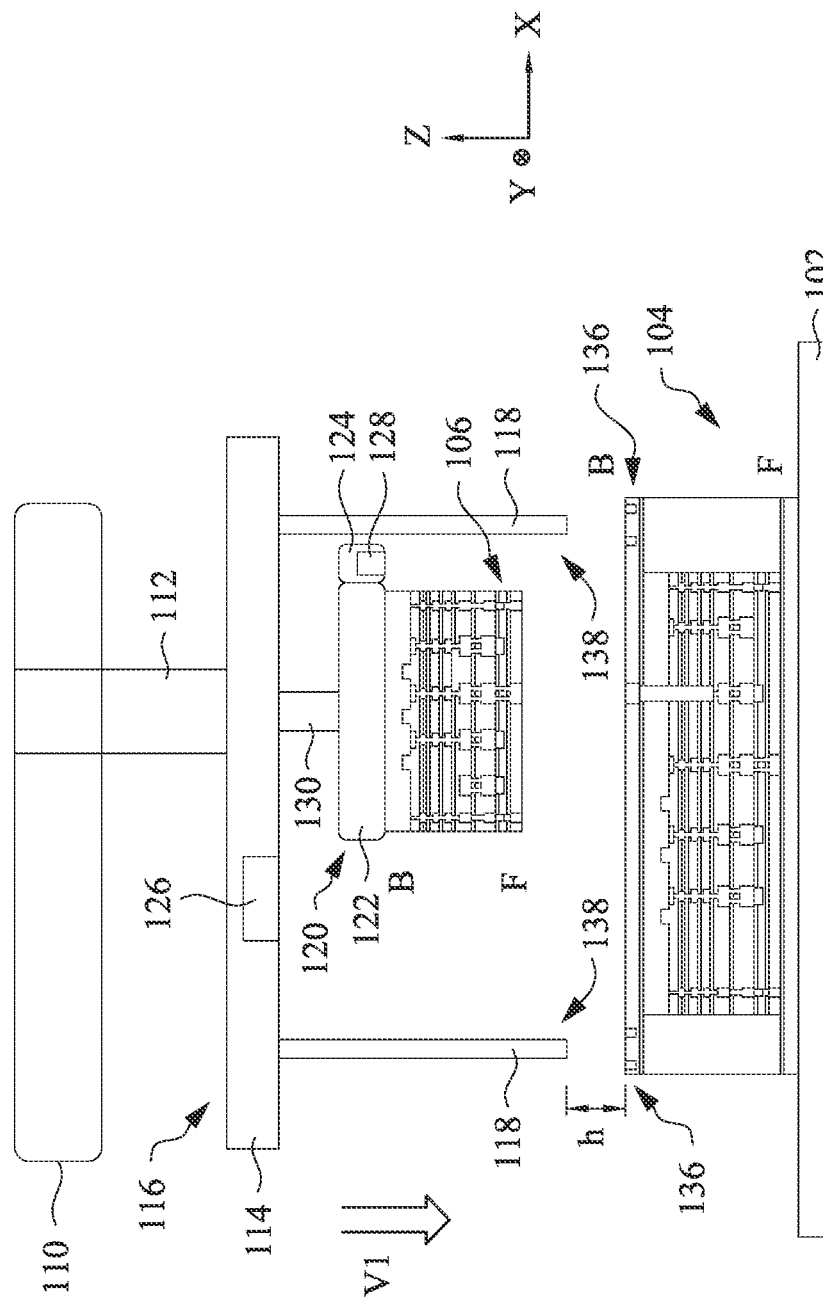
Figure 3D:
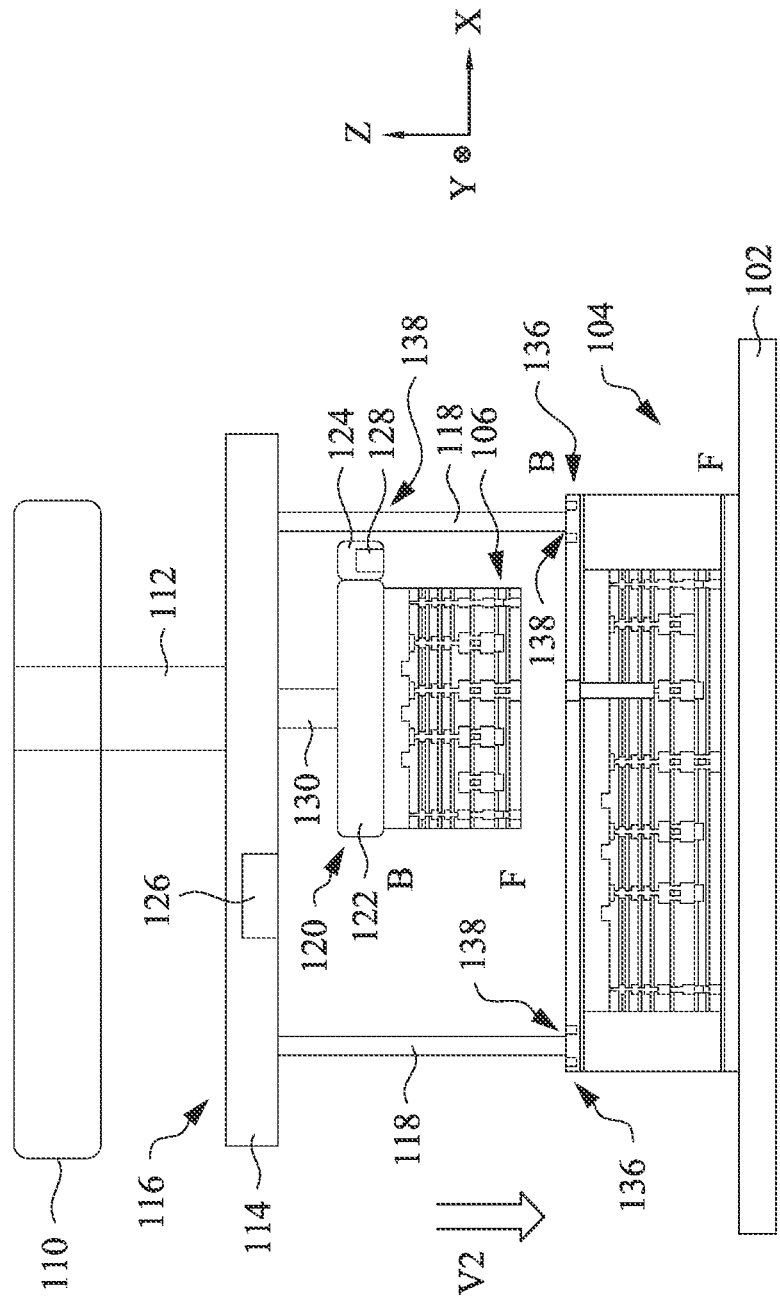

The method 200 then proceeds to operation 206, where the primary drive mechanism 110 drives the gantry 114 vertically to a predetermined height (denoted as "h" in FIG. 3C) at a first speed (denoted as "v1" in FIG. 3C). In the example shown in FIG. 3C, the predetermined height h is measured from the top surface of the bottom die 104 to the bottom of the stabilizer landing feet 138. In one embodiment, the predetermined height h is equal to or larger than 0.01 mm. In another embodiment, the predetermined height h is between 0.1 cm and 0.5 cm.

As shown in the example in FIG. 3B, after the vertical movement of the gantry 114, the stabilizer landing feet 138 are approaching the top surface of the bottom die 104, and the legs of the stabilizer 118 are still roughly aligned with the alignment patterns 136. It should be understood that the primary drive mechanism 110 can adjust the position of the gantry 114 in the X-Y plane using the vision alignment camera 126 and the vision alignment processor 172 during and/or after operation 206. It should be understood that in some embodiments, operations 204 and 206 can be carried out at the same time, and the vision alignment camera 126 and the vision alignment processor 172 can be employed for alignment in some embodiments.

The method 200 then proceeds to operation 208, where the secondary drive mechanism 116 drives the gantry 114 vertically at a second speed (denoted as "v2" in FIG. 3C) until the stabilizer 118 (specifically, the stabilizer landing feet 138) is in contact with the bottom die 104. In some implementations, the second speed v2 is slower than the first speed v1. As such, the touchdown of the stabilizer 118 (specifically, the stabilizer landing feet 138) is gentle, preventing it from moving or damaging the bottom die 104. In the example shown in FIG. 3D, the stabilizer landing feet 138 are in contact with the top surface of the bottom die 104 and aligned with the alignment patterns 136 in the X-Y plane. Likewise, it should be understood that the primary drive mechanism 110 can adjust the position of the gantry 114 in the X-Y plane using the vision alignment camera 126 and the vision alignment processor 172 during operation 208. Details of the alignment patterns 136 will be described below with reference to FIGS. 4A-10.

The method 200 then proceeds to operation 210, where the secondary drive mechanism 116 drives the suction head 120 such that the top die 106 is placed on the bottom die 104 at the target position. In one implementation, operation 210 can include operations 212, 214, and 216, where an alignment feedback loop is achieved using the optics alignment system 128. At operation 212, the optics alignment system 128 monitors the position of the suction head 120 relative to the bottom die 106. In some implementations, the optics alignment system 128 includes a light emitter and a light receiver, and the position of the suction head 120 can be calculated based on the received light after reflection, refraction, diffraction, or the combination thereof. In one example, the position is calculated by a processor inside the optics alignment system 128 located at the auxiliary region 124 of the suction head 120. In another example, the position is calculated by either the vision alignment processor 172 or the control unit 170 shown in FIG. 1. Details of monitoring the position of the suction head 120 using the optics alignment system 128 will be described below with reference to FIGS. 11-12.

At operation 214, an alignment feedback is generated based on the position of the suction head 120. Since both the position of the suction head 120 and the target position are known, an alignment feedback can be generated to fine-tune a position offset. For instance, the position offset is a microns in the X-direction and -b microns in the Y-direction. Since the secondary drive mechanism 116 has a movement resolution that is higher than that of the primary drive mechanism 110, the position offset can have a high resolution, which enables the fine-tuning of the position of the suction head 120. Likewise, in one example, the alignment feedback is generated by a processor inside the optics alignment system 128 located at the auxiliary region 124 of the suction head 120. In another example, the alignment feedback is generated by either the vision alignment processor 172 or the control unit 170 shown in FIG. 1.

At operation 216, the secondary drive mechanism 116 drives the suction head 120 based on the alignment feedback. In one implementation, the secondary drive mechanism 116 receive instructions from the control unit shown in FIG. 1 to drive the suction head both in the X-Y plane, according to the alignment feedback, and in the Z-direction.

Figure 3E:
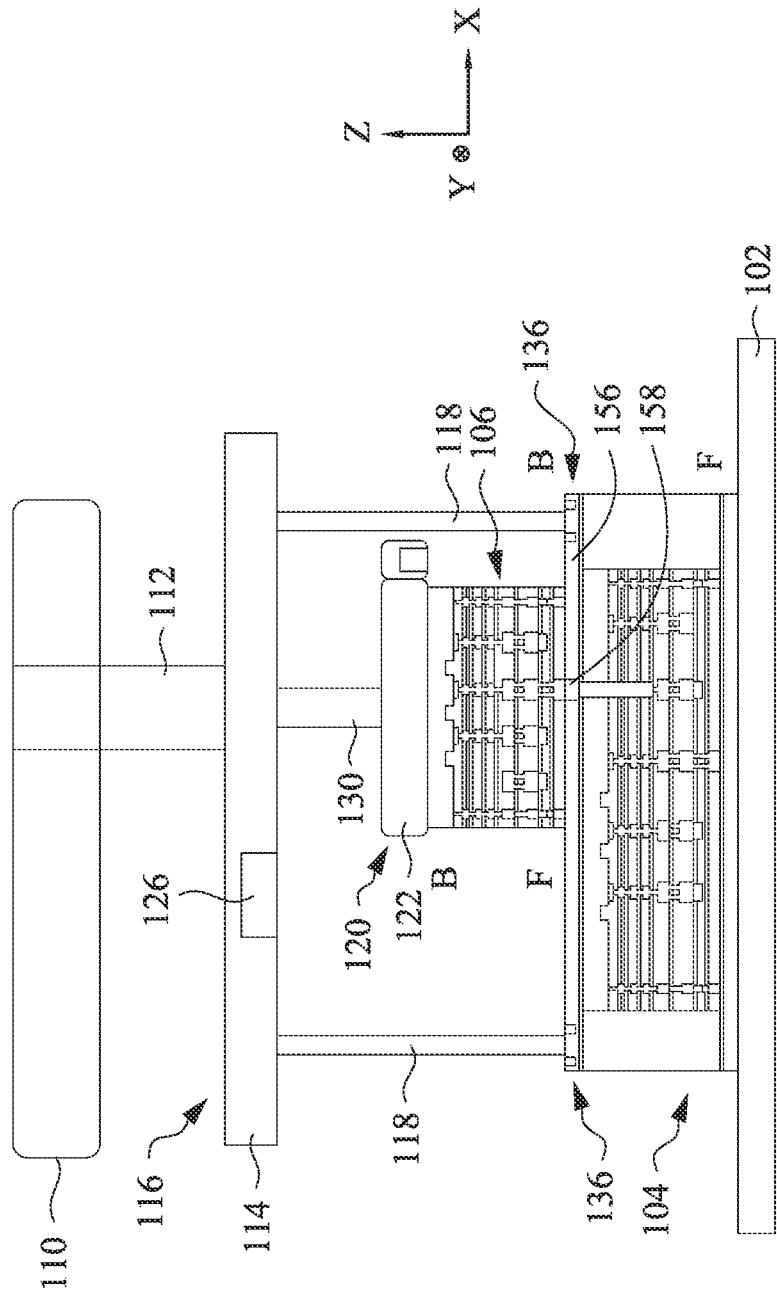

In the example shown in FIG. 3E, the top die 106 has been placed on the bottom die 104 at the target position. The bonding layers 156 on the bottom die 104 and the top die 106 are in contact with each other, and the bottom die 104 and the top die 106 are bonded together, for example, at room temperatures. On the other hand, the hybrid bonding metal pads 158 are aligned in the X-Y plane and in contact with each other, forming an electrical connection between the bottom die 104 and the top die 106. It should be understood that although the examples shown in FIGS. 1 and 3A-3E are related to hybrid bonding, the method 200 shown in FIG. 2 is not limited to those examples. That is, the method 200 shown in FIG. 2 is applicable to other contexts that a top die is placed on a bottom die using a pick-and-place system.

Figure 4A:
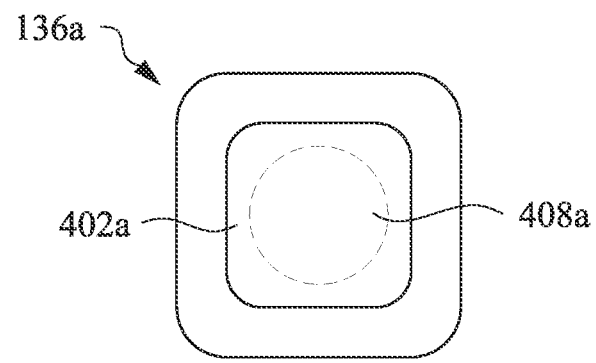
FIG. 4A is a top view of an example alignment pattern in accordance with some embodiments.
Figure 4B:
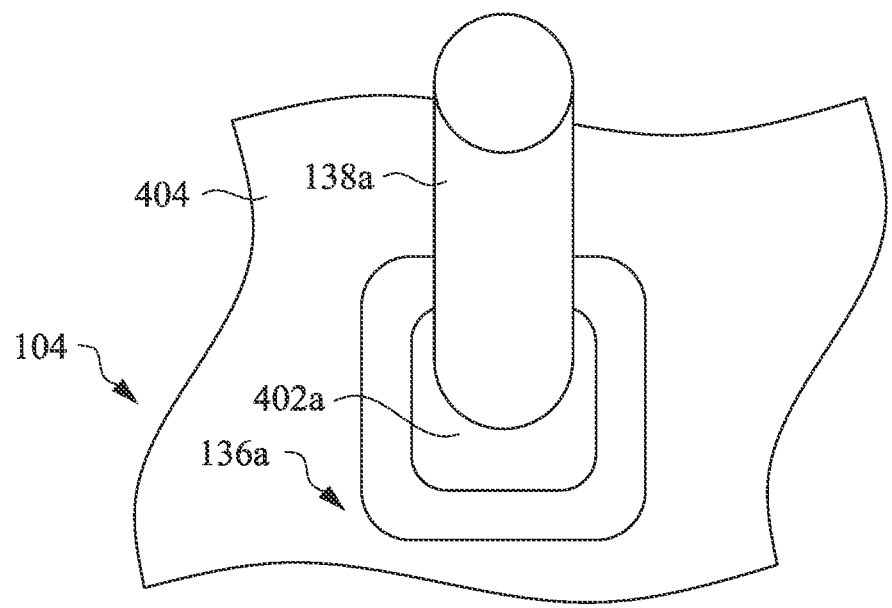
FIG. 4B is a perspective view of a stabilizer landing foot that is aligned with the alignment pattern shown in FIG. 4A in accordance with some embodiments.

FIG. 4A is a top view of an example alignment pattern 136a in accordance with some embodiments. FIG. 4B is a perspective view of a stabilizer landing foot 138a that is aligned with the alignment pattern 136a shown in FIG. 4A in accordance with some embodiments. In the example shown in FIG. 4A, the alignment pattern 136a is a square ring (i.e., a square with a central square hole inside), and the four corners are round corners. Thus, the alignment pattern 136a has a landing area 402 surrounded by the alignment pattern 136a. A target contact area 408a, located at the center of the landing area 402, is shown in the dashed line in FIG. 4A. In the example shown in FIG. 4B, the stabilizer landing foot 138a is aligned with the alignment pattern 136a. That is, the contact area between the stabilizer landing foot 138a and the top surface 404 of the bottom die 104 is within the landing area 402a. As mentioned above, the alignment between the stabilizer landing foot 138a and the alignment pattern 136a is being monitored in a real-time manner using the vision alignment camera 126 and the vision alignment processor 172 shown in FIG. 1 in some embodiments.

Figure 5:
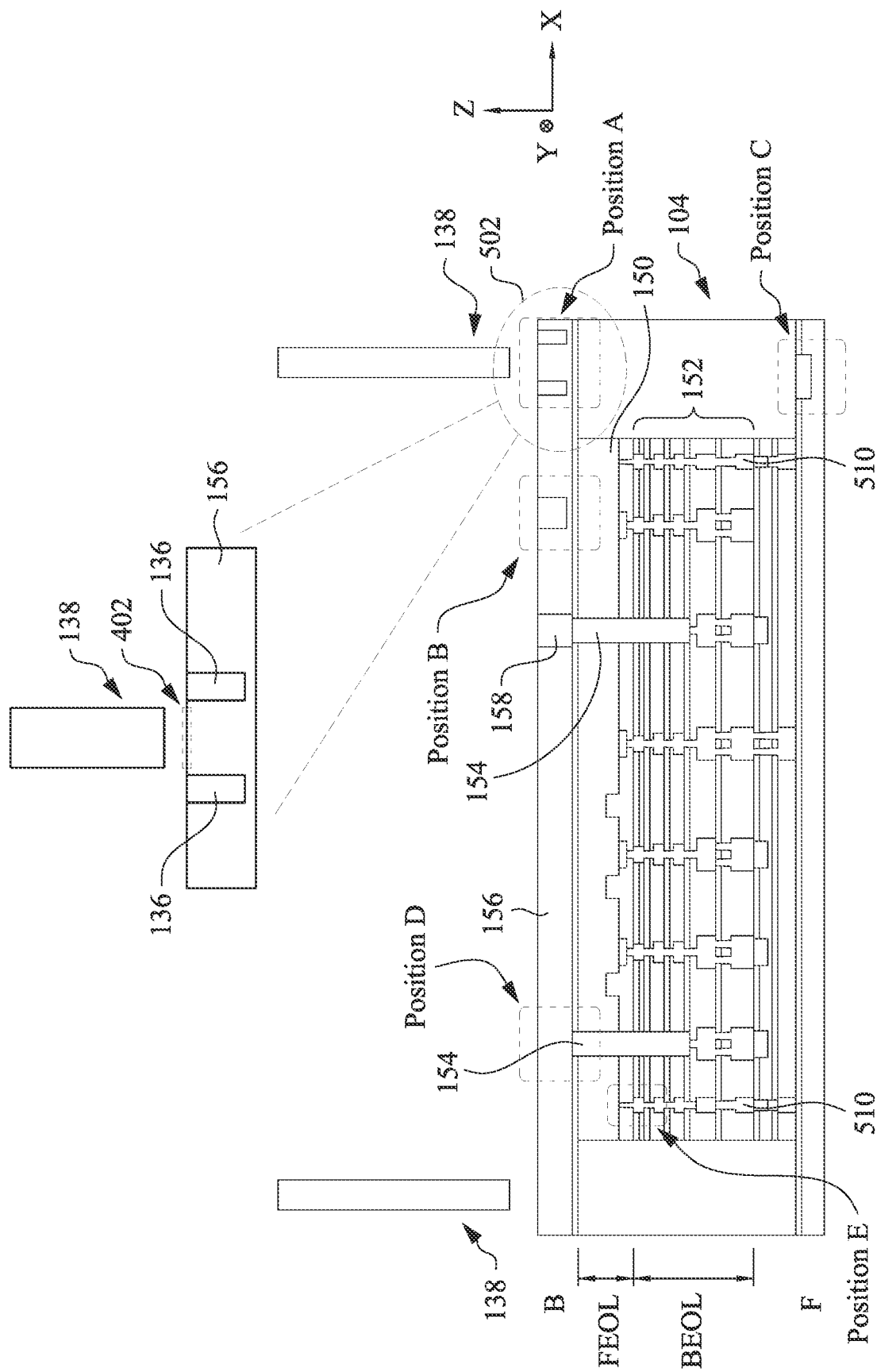
FIG. 5 is a side view of an example bottom die having alignment patterns nd stabilizer landing feet in accordance with some embodiments.

FIG. 5 is a side view of an example bottom die 104 having alignment patterns 136 and stabilizer landing feet 138 in accordance with some embodiments. In the example shown in FIG. 5, the alignment pattern 136 can be located at position A. The alignment pattern 136 is located in the bonding layer 156, and there is no semiconductor devices above or below the alignment pattern 136. The alignment pattern 136 is located outside the seal ring 510 in the horizontal plane (i.e., the X-Y plane). The alignment pattern 136 is an optically recognizable pattern such that it can be recognized by the vision alignment camera 126 of FIG. 1. In some implementations, the wavelength of the light being used is in the visible light range (i.e., about 380 nm to about 700 nm). In other implementations, the wavelength of the light being used is outside the visible light range. In one example, the wavelength of the light being used is in the in the infrared (IR) range (i.e., about 780 nm to about 1 mm). The alignment pattern 136 is made of a material having a refractive index or reflectivity different than that of the bonding layer 156. In one example, the bonding layer 156 is made of a dielectric such as SiO2, SiC, SiN, SiON, and the like, and the alignment pattern 136 is made of copper.

As shown in the enlarged illustration of the region 502, the landing area 402 can be made of one or more of the following materials: a dielectric (e.g., $SiO_2$, SiC, SiN, SiON, etc.); a metal (e.g., Cu, W, etc.); a metal compound (e.g., TaN, TiN, etc.); an organic material (e.g., a polyamide, etc.); and a single element material (e.g., Si, etc.) that can be used in semiconductor processing. In one implementation, the landing area 402 is made of a dielectric (e.g., $SiO_2$, SiC, SiN, SiON, etc.), which is cost-effective.

In another implementation, the alignment pattern 136 can be located at position B. The alignment pattern 136 is located in the bonding layer 156, and there are semiconductor devices above or below the alignment pattern 136. In yet another implementation, the alignment pattern 136 can be located at position C. The alignment pattern 136 is located at the front side of the bottom die 104, instead of the bonding layer 156. The alignment pattern 136 at position C can be used for alignment when the bottom die 104 is flipped, that is, the front side is facing upwardly.

Also, existing features in the bottom die 104 may be employed as alignment patterns. In one implementation, the alignment pattern 136 is located at position D and is a TSV 154. It should be understood that this example is not intended to be limiting and other features of the bottom die 104 that are visible-light observable may also be employed. In another implementation, the alignment pattern 136 is located at position E and is a seal ring. It should be understood that this example is not intended to be limiting and other features of the bottom die 104 that are IR observable may also be employed.

Figure 6:
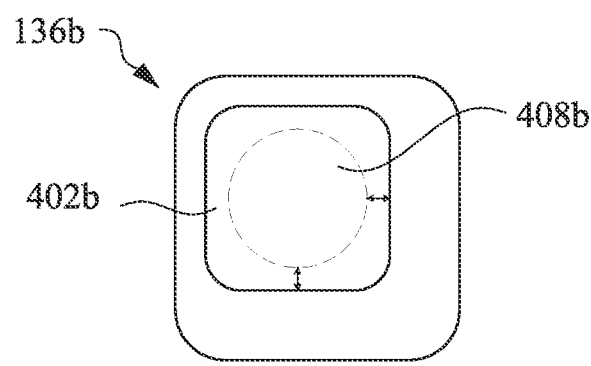
FIG. 6 is a top view of an example alignment pattern in accordance with some embodiments.

FIG. 6 is a top view of an example alignment pattern 136b in accordance with some embodiments. In the example shown in FIG. 6, the alignment pattern 136b is identical to the alignment pattern 136a shown in FIG. 4A except that the pattern widths at different sides are unequal. The alignment pattern 136b has a landing area 402b surrounded by the alignment pattern 136b. The target contact area 408b, located at the center of the landing area 402b, is shown in the dashed line in FIG. 6.

Figure 7:
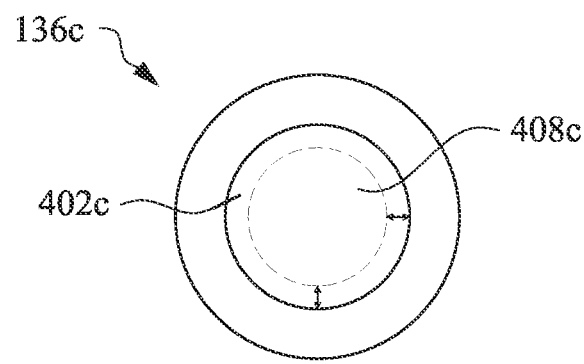
FIG. 7 is a top view of an example alignment pattern in accordance with some embodiments.

FIG. 7 is a top view of an example alignment pattern 136c in accordance with some embodiments. In the example shown in FIG. 7, the alignment pattern 136c is a circular ring. Thus, the alignment pattern 136c has a circular landing area 402c surrounded by the alignment pattern 136c. The target contact area 408c, located at the center of the landing area 402c, is shown in the dashed line in FIG. 7. It should be understood that in another embodiment, a portion of the example alignment pattern 136c (e.g., half of the circular ring, a circular arc, etc.) can be employed.

Figure 8:
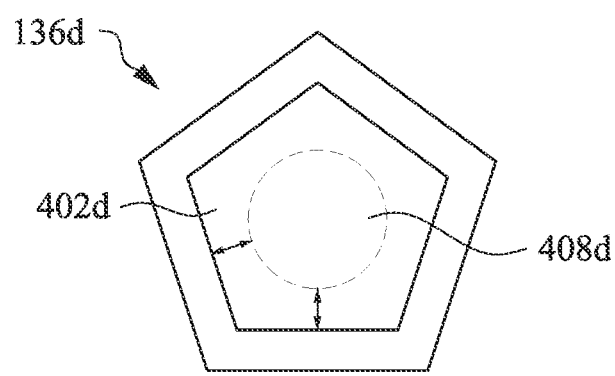
FIG. 8 is a top view of an example alignment pattern in accordance with some embodiments.

FIG. 8 is a top view of an example alignment pattern 136d in accordance with some embodiments. In the example shown in FIG. 8, the alignment pattern 136d is in a polygon shape and has a landing area 402d in the same polygon shape (but smaller) surrounded by the alignment pattern 136d. The target contact area 408d, located at the center of the landing area 402d, is shown in the dashed line in FIG. 6. It should be understood that any polygon shape (e.g., a hexagon shape, an octagon shape, an arbitrary polygon having seven sides, etc.) can be employed.

Figure 9:
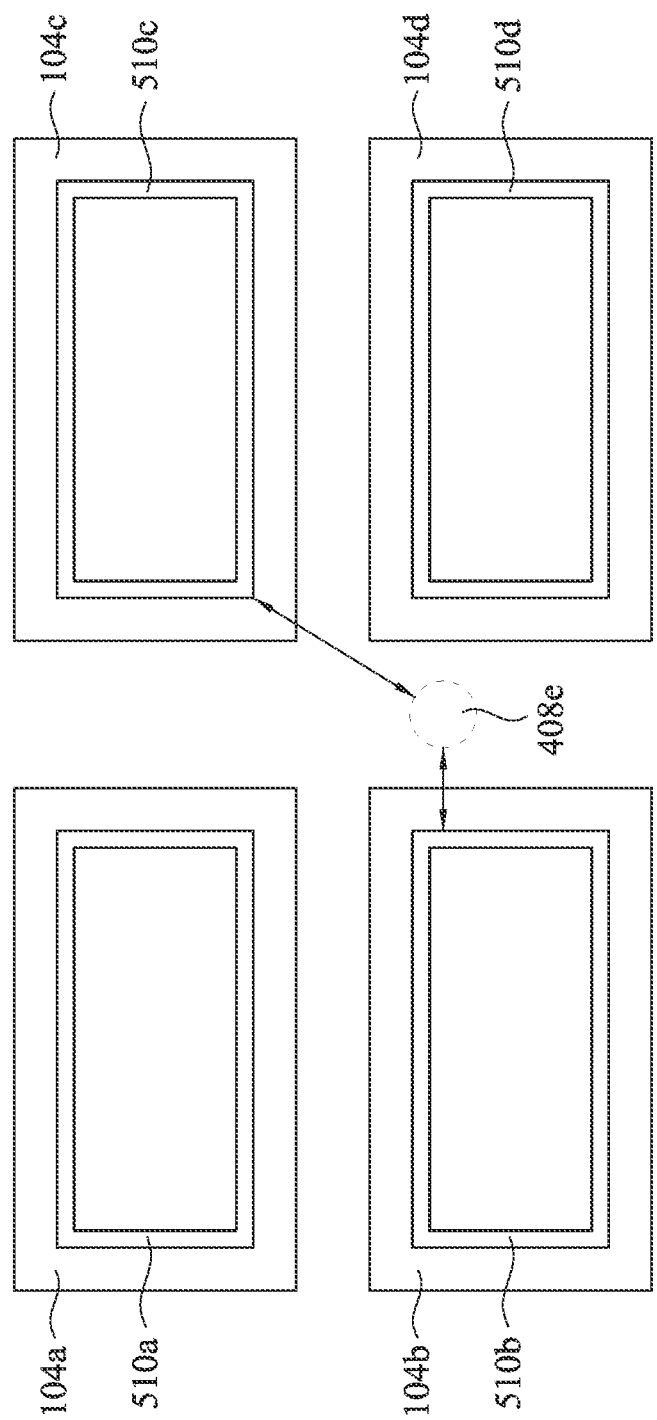
FIG. 9 is a top view of an example target contact area in accordance with some embodiments.

FIG. 9 is a top view of an example target contact area 408e in accordance with some embodiments. In the example shown in FIG. 9, existing features in a bottom die are employed as alignment patterns. Specifically, four bottom dies 104a, 104b, 104c, and 104d are located on a host wafer and have seal rings 510a, 510b, 510c, and 510d, respectively. In the example shown in FIG. 9, a target landing area 408e is chosen based on the locations of the seal rings 510a, 510b, 510c, and 510d. It should be understood that the location of the target landing area 408e is just an example, and other target landing areas may be chosen as well. In some implementations, the designer of the host wafer can specify the target landing area 408e in advance. In other implementations, the pick-and-place system 100 shown in FIG. 1 can choose the location of the target landing area 408e on the fly based on the topology of the host wafer, if the target landing area 408e has not been specified in advance. It should be understood that the example shown in FIG. 9 is not intended to be limiting and other features (e.g., TSVs) of a bottom die may be employed as alignment patterns.

Figure 10:
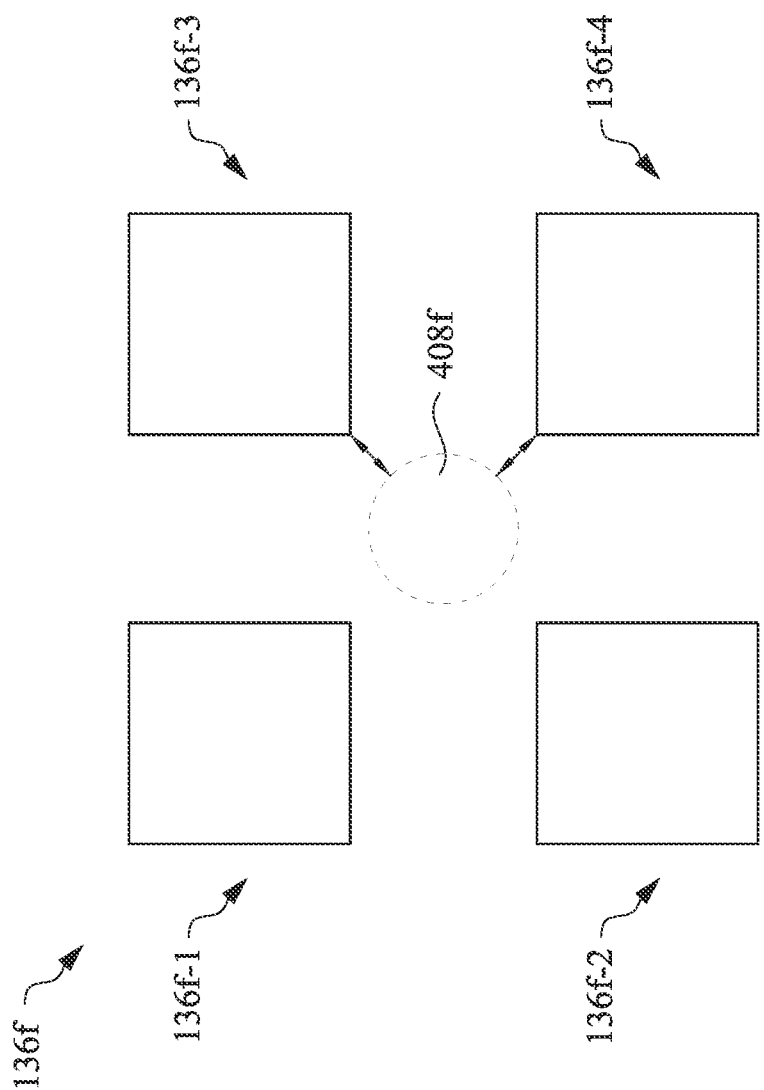
FIG. 10 is a top view of an example alignment pattern in accordance with some embodiments.

FIG. 10 is a top view of an example alignment pattern 136f in accordance with some embodiments. In the example shown in FIG. 10, the alignment pattern 136f is comprised of four alignment patterns 136f-1, 136f-2, 136f-3, and 136f-4, which are identical to the alignment pattern 136a shown in FIG. 4A. In the example shown in FIG. 10, a target landing area 408f is chosen at the center of the alignment pattern 136f. It should be understood that the location of the target landing area 408f is just an example, and other target landing areas may be chosen as well.

Figure 11:
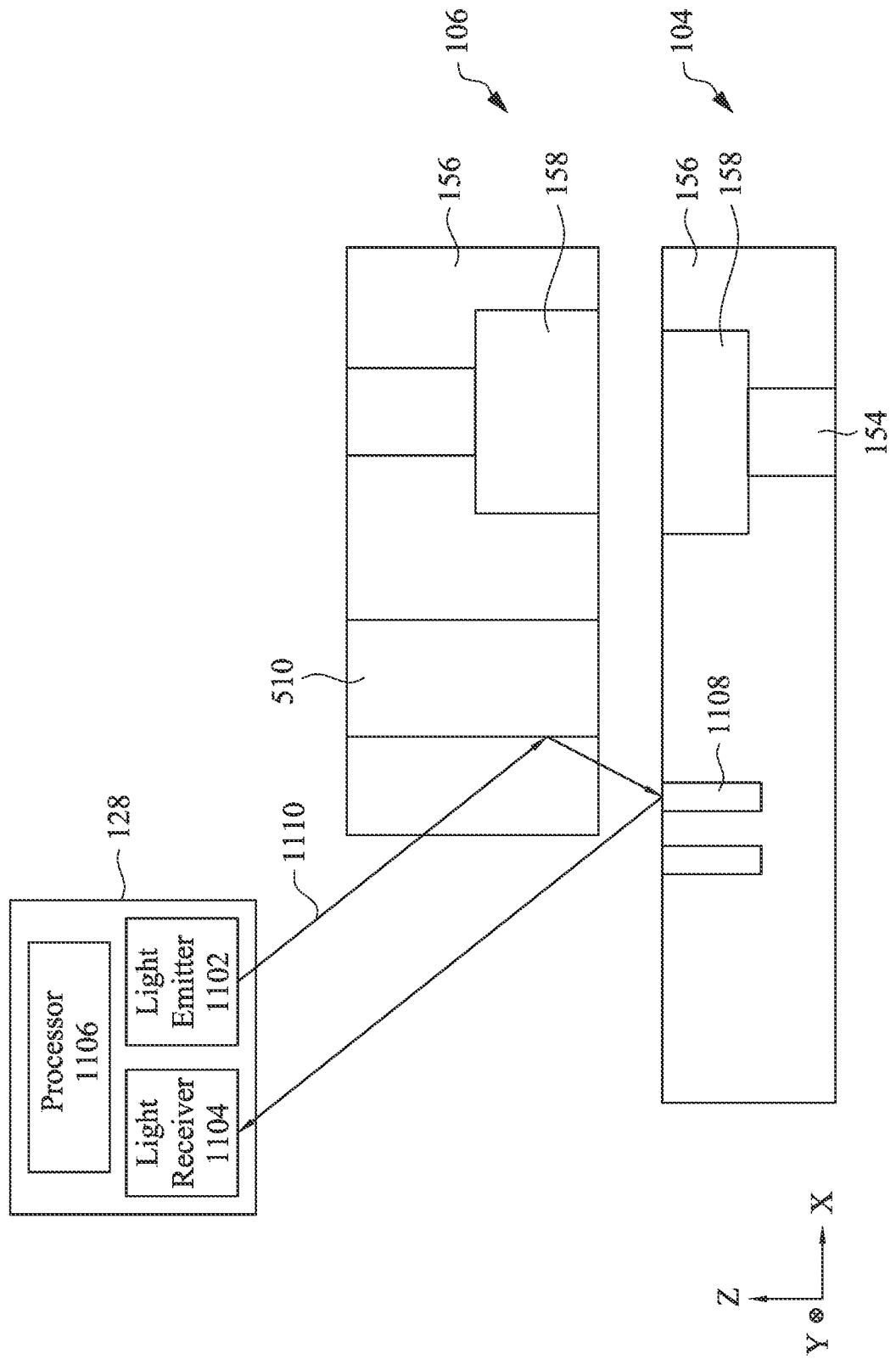
FIG. 11 is a diagram illustrating the functioning of an example optics alignment system in accordance with some embodiments.

FIG. 11 is a diagram illustrating the functioning of an example optics alignment system 128 in accordance with some embodiments. In the example shown in FIG. 11, the top die 106 is to be placed on the bottom die 104 at the target position. The bonding layers 156 will be in contact with each other as the suction head 120 shown in FIG. 1 descends in the Z-direction, and the hybrid bonding metal pads 158 are supposed to be aligned in the X-Y plane. The sealing ring 510 of the top die 106 extends vertically into the bonding layer 156. Some fine-tune alignment patterns 1108 are located in the bonding layer 156 of the bottom die 104. In the example shown in FIG. 11, the optics alignment system 128 is located to the left of the top die 106 in the X-Y plane. The optics alignment system 128 includes, among other things, a processor 1106, a light emitter 1102, and a light receiver 1104. In one example, the light emitter 1102 is a laser and emits a light 1110 toward the seal ring 510. In one implementation, the light 1110 is an infrared light which is able to penetrate the bonding layer 156 of the top die 106, while the seal ring 510 and the fine-tune alignment patterns 1108 can reflect the infrared light (i.e., "infrared observable"). It should be understood that although an infrared light is used as an example, it is not intended to be limiting, and other wavelength ranges can be employed if appropriate. The light receiver 1104 then receives the light 1110 after refraction and reflection and generates a received signal. As the position of the top die 106 changes relative to the bottom die 104, the received signal changes accordingly. The processor 1106 can determine the position of the top die 106 based on the received signal. As such, the optics alignment system 128 monitors the position of the suction head based on the fine-tune alignment patterns 1108 located at the bottom die 104. It should be understood that, in other implementations, the processor 1106 can be implemented as the vision alignment processor 172 or the control unit 170 shown in FIG. 1, which is not located in the optics alignment system 128 situated at the auxiliary region 124 of the suction head 120 shown in FIG. 1.

Figure 12:
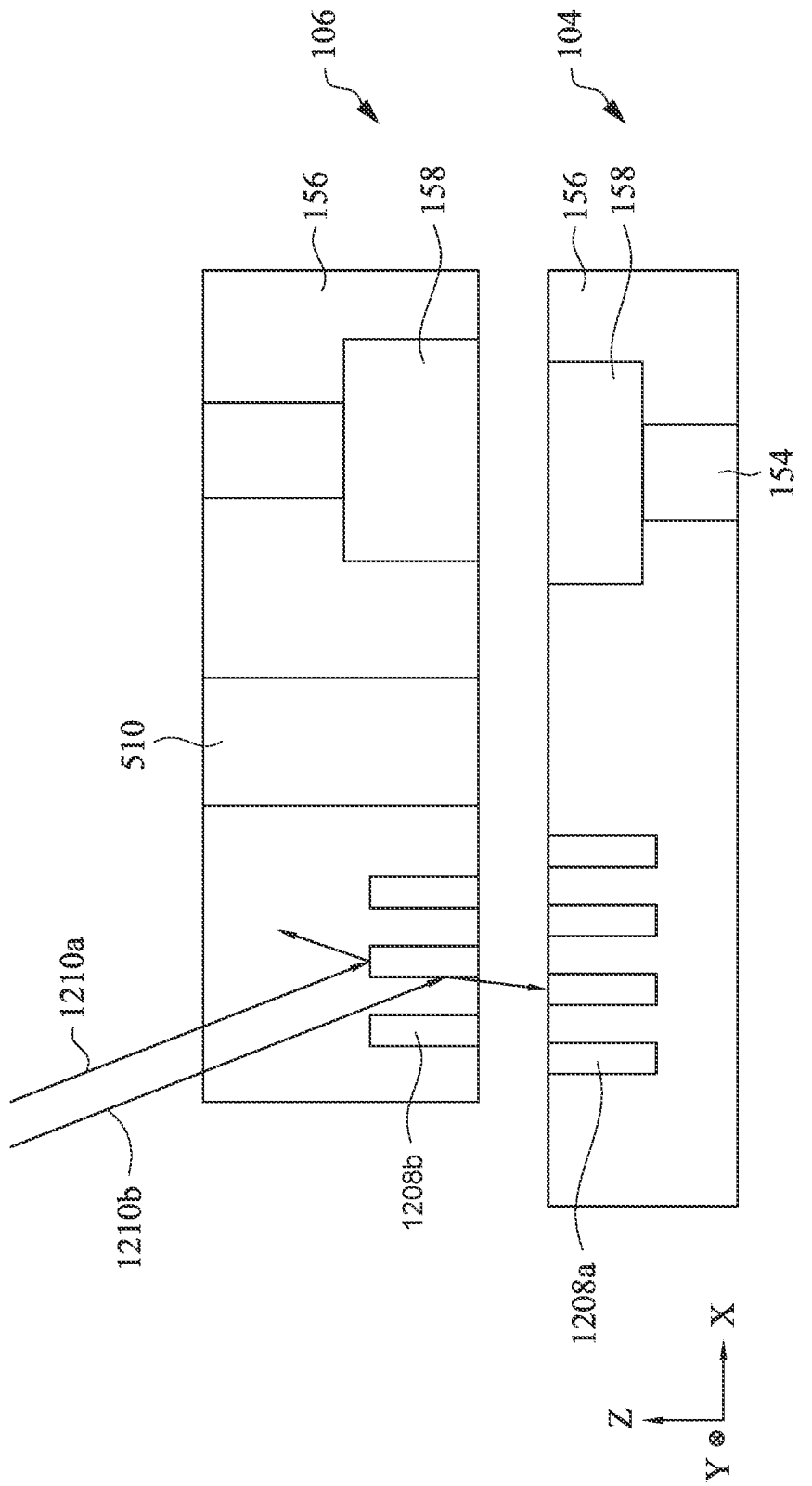
FIG. 12 is a diagram illustrating the functioning of another example optics alignment system in accordance with some embodiments.

FIG. 12 is a diagram illustrating the functioning of another example optics alignment system in accordance with some embodiments. In the example shown in FIG. 12, the top die 106 is to be placed on the bottom die 104 at the target position. The bonding layers 156 will be in contact with each other as the suction head 120 shown in FIG. 1 descends in the Z-direction, and the hybrid bonding metal pads 158 are supposed to be aligned in the X-Y plane. The sealing ring 510 of the top die 106 extends vertically into the bonding layer 156. Some fine-tune alignment patterns 1208a and 1208b are located in the bonding layers 156 of the bottom die 104 and the top die 106, respectively. In the example shown in FIG. 12, the fine-tune alignment patterns 1208a and 1208b are both diffraction gating structures, each having periodic patterns. When the hybrid bonding metal pads 158 are aligned in the X-Y plane, the fine-tune alignment patterns 1208a and 1208b are supposed to be aligned in the X-Y plane as well. On the other hand, when the hybrid bonding metal pads 158 are not aligned in the X-Y plane, as shown in FIG. 12, the fine-tune alignment patterns 1208a and 1208b are not aligned in the X-Y plane with some offset. As a result, the light 1210a emitted from a light emitter reflects as it meets the fine-tune alignment pattern 1208b in the top die 106, whereas the light 1210b emitted from the light emitter reflects as well as it meets the fine-tune alignment pattern 1208a in the bottom die 104. Similarly, a light receiver then receives the light after diffraction and generates a received signal. Therefore, the received signal changes accordingly as the position of the top die 106 changes relative to the bottom die 104. As such, the optics alignment system 128 monitors the position of the suction head based on the fine-tune alignment patterns 1208a and 1208b located at the bottom die 104 and the top die 106, respectively. In some implementations, a processor can determine the position of the top die 106 based on the received signal. The processor can be implemented either as the vision alignment processor 172 or the control unit 170 shown in FIG. 1, or as a separate processor located in the optics alignment system 128 situated at the auxiliary region 124 of the suction head 120 shown in FIG. 1.

It should be understood that although the examples shown in FIG. 11 and FIG. 12 are related to optics alignment systems based on reflection, refraction, or diffraction, they are not intended to be limiting. In other implementations, the optics alignment system 128 shown in FIG. 1 may be based on vision-assistant alignment. For example, the optics alignment system 128 shown in FIG. 1 may include a vision alignment camera similar to the vision alignment camera 126 shown in FIG. 1 and relies on the vision alignment processor 172 shown in FIG. 1. The vision alignment camera for the optics alignment system 128 may have better performance (e.g., higher resolution) than the vision alignment camera 126 as the alignment of the suction head 120 is fine-tuned.

Figure 13:
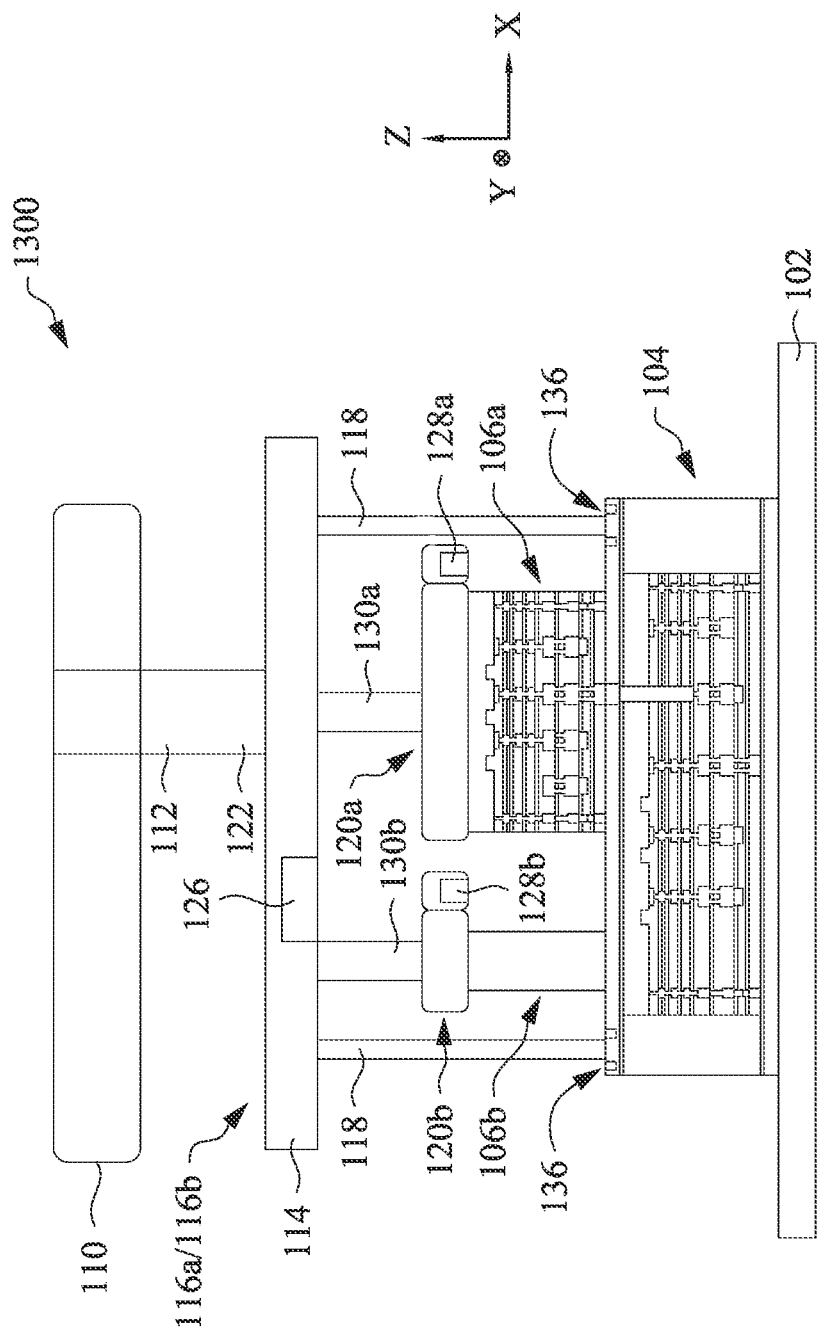
FIG. 13 is a schematic diagram illustrating an example pick-and-place system in accordance with some embodiments.

FIG. 13 is a schematic diagram illustrating an example pick-and-place system 1300 in accordance with some embodiments. The pick-and-place system 1300 is identical to the pick-and-place system 100 shown in FIG. 1, except that the pick-and-place system 1300 has two suction heads 120a and 120b, which can operate separately and simultaneously. Specifically, the suction head 120a and the gantry 114 are connected through the suction shaft 130a, whereas the suction head 120b and the gantry 114 are connected through the suction shaft 130b. Two secondary drive mechanisms 116a and 116b are located at the gantry 114 and can drive the suction head 120a and the suction head 120b in the vertical direction and in the horizontal plane, separately.

In the example shown in FIG. 13, the suction head 120a places the top die 106a, which is a functional die, on the bottom die 104, whereas the suction head 120b places the top die 106b, which is a dummy die, on the bottom die 104. It should be understood that this is not intended to be limiting. In other examples, both the top die 106a and the top die 106b can be functional dies.

The suction head 120a and the suction head 120bb share the stabilizer 118 while they can operate separately and simultaneously, thus achieving higher operation efficiency and still keeping the stability provided by the stabilizer 118.

Each of the suction shafts 130a and 130b is connected to a vacuum device. In other implementations, the suction shafts 130a and 130b are connected to the same vacuum device. Also, each of the suction heads 120a and 120b has its own optics alignment system to make sure that the top dies 106a and 106b are placed at their target positions using the alignment feedback loop explained above with reference to FIG. 2. It should be understood that although two suction heads are shown in FIG. 13, it is not intended to be limiting. In other embodiments, more than two suction heads can share the same stabilizer while operating separately and simultaneously.

In accordance with some aspects of the disclosure, a pick-and-place system is provided. The pick-and-place system includes: a wafer holder configured to hold a bottom die; a gantry having a stabilizer extending downwardly; a primary drive mechanism connected to the gantry and configured to drive the gantry horizontally and vertically; a suction head configured to hold a top die; and a secondary drive mechanism located at the gantry and connected to the suction head and configured to drive the suction head horizontally and vertically to place the top die on the bottom die at a target position. The primary drive mechanism drives the gantry vertically until the stabilizer is in contact with the bottom die before the secondary drive mechanism drives the suction head.

In accordance with some aspects of the disclosure, a method for operating a pick-and-place system is provided. The method includes: picking, by a suction head, a top die; driving, by a primary drive mechanism, a gantry connected to the primary drive mechanism above a bottom die; driving, by the primary drive mechanism, the gantry vertically until a stabilizer extending downwardly from the gantry is in contact with the bottom die; and driving, by a secondary drive mechanism located at the gantry and connected to the suction head, the suction head horizontally and vertically to place the top die on the bottom die at a target position.

In accordance with some aspects of the disclosure, a pick-and-place system is provided. The pick-and-place system includes: a wafer holder configured to hold a bottom die; a gantry having a stabilizer extending downwardly; a primary drive mechanism connected to the gantry and configured to drive the gantry horizontally and vertically; a first suction head configured to hold a first top die; a second suction head configured to hold a second top die; a first secondary drive mechanism located at the gantry and connected to the first suction head and configured to drive the first suction head horizontally and vertically to place the first top die on the bottom die at a first target position; and a second secondary drive mechanism located at the gantry and connected to the second suction head and configured to drive the second suction head horizontally and vertically to place the second top die on the bottom die at a second target position. The primary drive mechanism drives the gantry vertically until the stabilizer is in contact with the bottom die before the first secondary drive mechanism drives the first suction head and the second secondary drive mechanism drives the second suction head.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pick-and-place system comprising:
   a wafer holder configured to hold a bottom die;
   a gantry having a stabilizer extending downwardly;
   a primary drive mechanism connected to the gantry and configured to drive the gantry horizontally and vertically;
   a suction head configured to hold a top die; and
   a secondary drive mechanism located at the gantry and connected to the suction head and configured to drive the suction head horizontally and vertically to place the top die on the bottom die at a target position; and
   wherein the primary drive mechanism drives the gantry vertically until the stabilizer is in contact with the bottom die before the secondary drive mechanism drives the suction head.

2. The pick-and-place system of claim 1, wherein the stabilizer includes three or more legs extending downwardly from the gantry.

3. The pick-and-place system of claim 2, wherein the three or more legs have three stabilizer landing feet respectively, and the bottom die has three or more alignment patterns on a top surface of the bottom die corresponding to the three or more legs, respectively.

4. The pick-and-place system of claim 3, wherein when the stabilizer is in contact with the bottom die, the three or more stabilizer landing feet are aligned with the three or more alignment patterns.

5. The pick-and-place system of claim 3, wherein the top die and the bottom die are bonded using hybrid bonding.

6. The pick-and-place system of claim 5, wherein a bonding layer of the bottom die and a bonding layer of the top die are in contact, and the three or more alignment patterns are located in the bonding layer of the bottom die.

7. The pick-and-place system of claim 3 further comprising:
   a vision alignment camera located at the gantry configured to detect a position of the gantry based on the three or more alignment patterns and assist the primary drive mechanism in aligning the three or more stabilizer landing feet with the three or more alignment patterns, respectively.

8. The pick-and-place system of claim 1 further comprising:
   a vision alignment camera located at the gantry configured to detect a position of the gantry to assist the primary drive mechanism in driving the gantry to a target gantry position.

9. The pick-and-place system of claim 1 further comprising:
   an optics alignment system located at the suction head and configured to:
      monitor a position of the suction head; and generate an alignment feedback based on the position of the suction head.

10. The pick-and-place system of claim 9, wherein the secondary drive mechanism drives the suction head based on the alignment feedback.

11. The pick-and-place system of claim 9, wherein the monitoring is based on a fine-tune alignment pattern located at the bottom die.

12. The pick-and-place system of claim 9, wherein the monitoring is based on fine-tune alignment patterns located at the bottom die and the top die.

13. The pick-and-place system of claim 1, wherein the secondary drive mechanism has a higher movement resolution than the primary drive mechanism.

14. A method for operating a pick-and-place system comprising:
  picking, by a suction head, a top die;
  driving, by a primary drive mechanism, a gantry connected to the primary drive mechanism above a bottom die;
  driving, by the primary drive mechanism, the gantry vertically until a stabilizer extending downwardly from the gantry is in contact with the bottom die; and
  driving, by a secondary drive mechanism located at the gantry and connected to the suction head, the suction head horizontally and vertically to place the top die on the bottom die at a target position.

15. The method of claim 14, wherein the driving, by the primary drive mechanism, the gantry vertically until the stabilizer extending downwardly from the gantry is in contact with the bottom die comprises:
  driving, by the primary drive mechanism, the gantry vertically to a predetermined height at a first speed; and
  driving, by the primary drive mechanism, the gantry vertically at a second speed until the stabilizer extending downwardly from the gantry is in contact with the bottom die, wherein the second speed is slower than the first speed.

16. The method of claim 14, wherein the driving, by the secondary drive mechanism, the suction head horizontally and vertically to place the top die on the bottom die at the target position comprises:
  monitoring, by an optics alignment system, a position of the suction head;
  generating an alignment feedback based on the position of the suction head; and
  driving, by the secondary drive mechanism, the suction head based on the alignment feedback.

17. The method of claim 14, wherein the stabilizer includes three or more legs extending downwardly from the gantry.

18. The method of claim 17, wherein each of the three or more legs has a stabilizer landing foot, and the bottom die has three or more alignment patterns on a top surface of the bottom die corresponding to the three or more legs, respectively.

19. A pick-and-place system comprising:
  a wafer holder configured to hold a bottom die;
  a gantry having a stabilizer extending downwardly;
  a primary drive mechanism connected to the gantry and configured to drive the gantry horizontally and vertically;
  a first suction head configured to hold a first top die;
  a second suction head configured to hold a second top die;
  a first secondary drive mechanism located at the gantry and connected to the first suction head and configured to drive the first suction head horizontally and vertically to place the first top die on the bottom die at a first target position; and
  a second secondary drive mechanism located at the gantry and connected to the second suction head and configured to drive the second suction head horizontally and vertically to place the second top die on the bottom die at a second target position; and
  wherein the primary drive mechanism drives the gantry vertically until the stabilizer is in contact with the bottom die before the first secondary drive mechanism drives the first suction head and the second secondary drive mechanism drives the second suction head.

20. The pick-and-place system of claim 19, wherein the first suction head and the second suction head operate separately and simultaneously.

* * * * *